United States Patent [19]
Schulmann et al.

[11] Patent Number: 5,762,703
[45] Date of Patent: Jun. 9, 1998

[54] METHOD AND APPARATUS FOR PULLING MONOCRYSTALS FROM A MELT CONTAINED IN A CRUCIBLE

[75] Inventors: Winfried Schulmann, Kleinostheim; Franz Thimm, Alzenau; Helmut Kaiser, Bruchköbel, all of Germany

[73] Assignee: Balzers UND Leybold Deutschland holding AG, Hanau Am Main, Germany

[21] Appl. No.: 724,438

[22] Filed: Oct. 1, 1996

[30] Foreign Application Priority Data

Oct. 19, 1995 [DE] Germany ............ 195 38 857.7

[51] Int. Cl.⁶ .................................................. C30B 15/24
[52] U.S. Cl. ............................... 117/13; 117/14; 117/218
[58] Field of Search ............................. 117/35, 200, 208, 117/215, 218, 900, 13, 14, 216; 65/DIG. 8

[56] References Cited

U.S. PATENT DOCUMENTS 3,822,111  7/1974  Suzuki et al. ............... 117/215
4,301,120  11/1981  Sibley ........................... 117/218
4,350,560  9/1982  Helgeland et al. .............. 117/35

FOREIGN PATENT DOCUMENTS 63-201091  12/1988  Japan.
63315588  4/1989  Japan.

*Primary Examiner*—Felisa Garrett
*Attorney, Agent, or Firm*—Felfe & Lynch

[57] ABSTRACT

A puller (22) above the melt extracts a crystal (8) upwardly out of the melt surface into a laterally turnable airlock chamber (5) An uncoupling device (7) provided between the crystal (8) and the puller permits the severance of the crystal (8) from the puller. The device (7) is formed by a coupling ring (10) connected to the pull shaft (22) and having a longitudinal slot (9) which cooperates with a crystal holder which is provided with a mushroom-shaped head part (11), and by an airlock ring (14) held by the cover plate (15) of the airlock chamber (5). Airlock gates (13, 13') journaled on the airlock ring (14) pivot about horizontal axes (35, 35') from a horizontal locking position to a vertical open position and vice versa, their end faces (16, 16') forming an opening (17) in the locking position, thereby encompassing the shaft (19) of the seed holder (12) to lock it in the plane of the airlock ring (14).

6 Claims, 5 Drawing Sheets

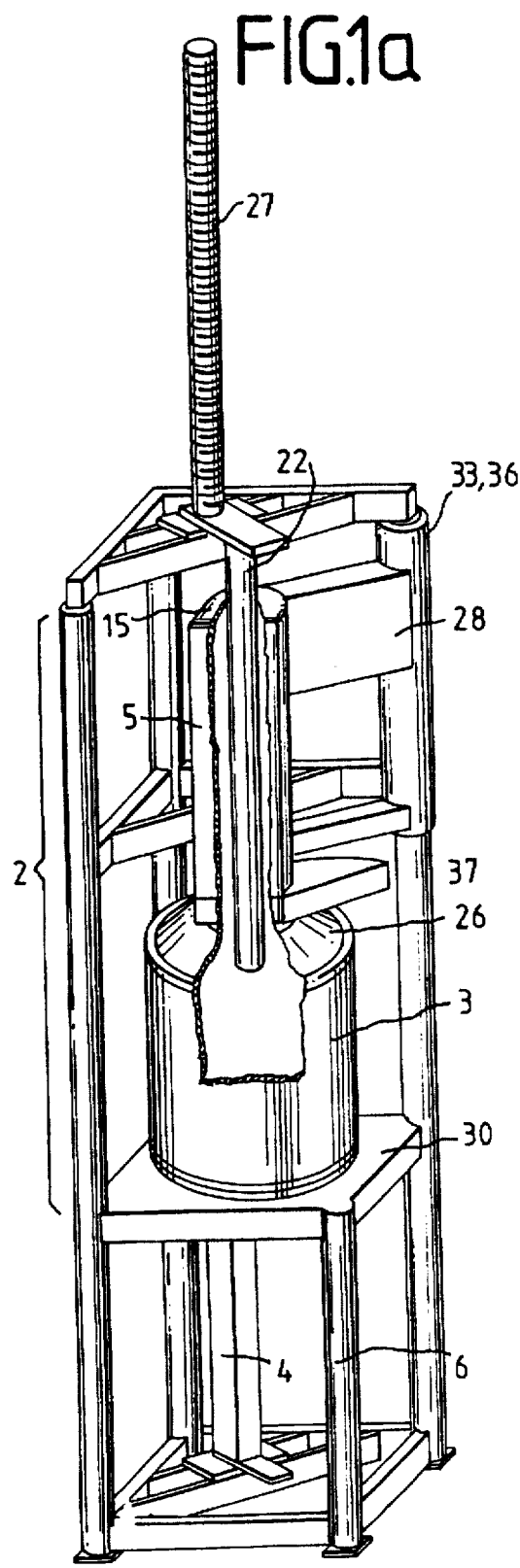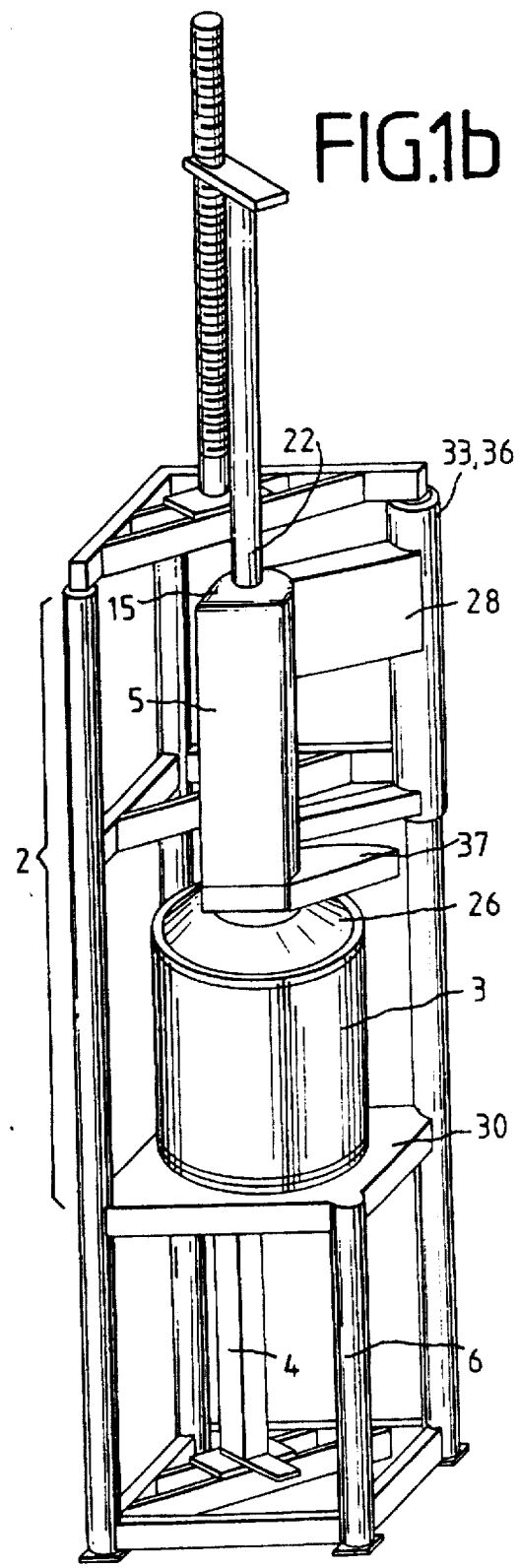

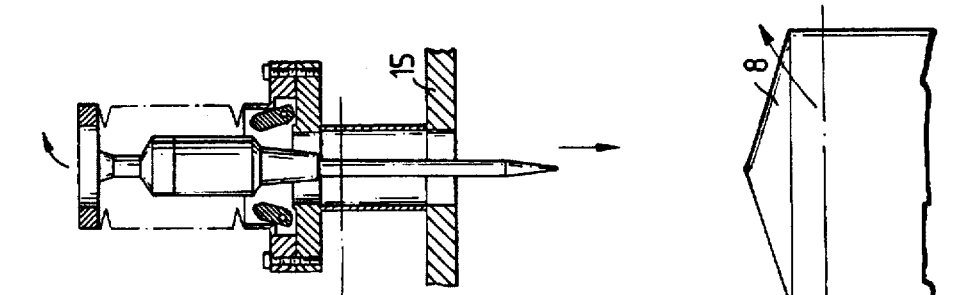
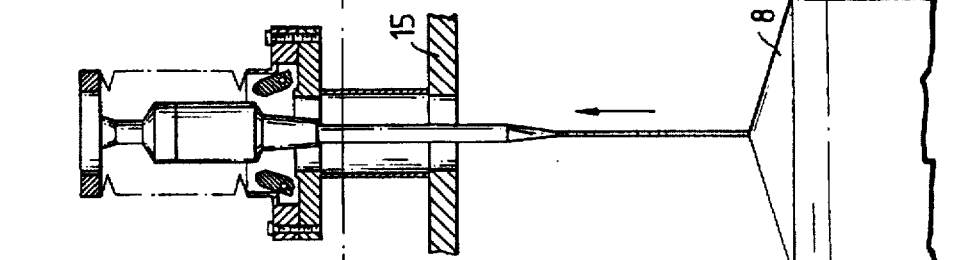
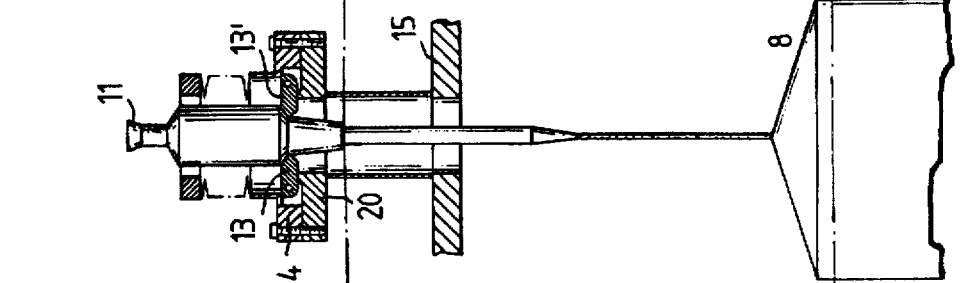
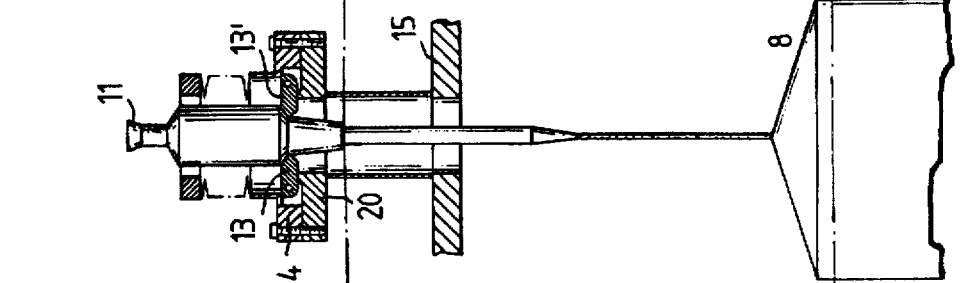
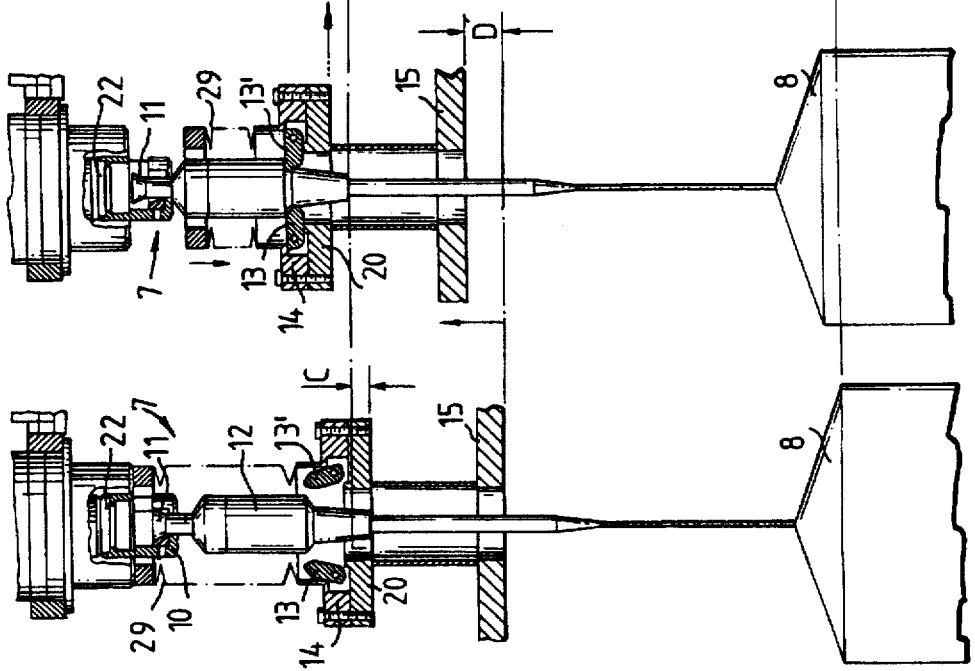

METHOD AND APPARATUS FOR PULLING MONOCRYSTALS FROM A MELT CONTAINED IN A CRUCIBLE

BACKGROUND OF THE INVENTION

The invention relates to a method and apparatus for pulling monocrystals out of a melt contained in a crucible, under a vacuum or under a shielding gas at reduced pressure, wherein the crucible is disposed in a vacuum chamber supported on a base frame and can be heated by the thermal radiation of a heating element. A puller is provided above the melt by which the crystal can be pulled upward from the melt surface to an airlock chamber, and an uncoupling device is provided which is disposed between the crystal and the puller and permits the separation of the crystal from the puller.

Usually the crystal suspended from the seed crystal in the airlock chamber is gripped by a special handling system through a lateral opening provided on the airlock, then severed from the seed, and finally removed by means of the handling system laterally from the airlock through the opening which can be closed by a gate.

This known method has a series of disadvantages, all of which are the result of the special sensitivity of the crystal against shock and vibration. Furthermore, there is the danger that the crystal will not be correctly grasped by the handling system, because while it is hanging inside the airlock it is not freely accessible.

Apparatus are also known in which, after the pulling process and after the airlock is vented, the airlock, together with the bulky and heavy pulling shaft and with the shaft drive, is swung on the frame of the apparatus, so that the crystal can be lowered onto a car brought under the airlock. Such apparatus, however, have the very decided disadvantage that, with the size of the pulling device and the weight of its component parts, the position of the individual parts in relation to one another that is necessary for the pulling process cannot be assured in continuous operation; especially, experience shows that maneuvering the delicate and highly precise pulling shaft into its working position above the melt, always at the correct angle, is scarcely possible.

SUMMARY OF THE INVENTION

The present invention is addressed to removing the finished crystal from the airlock chamber safely and shock-free, without the need for removing delicate parts of the apparatus from their working position.

According to the invention the uncoupling device is formed of a coupling ring having a longitudinal slot and connected with the puller, a holder provided with a mushroom-shaped head portion, and a lock ring held on the cover plate with two airlock gates journaled on it. The airlock gates can be pivoted about horizontal axes from a horizontal locking position to a vertical open position and vice versa in the manner of airlock gates, while their end surfaces remote from their axes and facing one another in the locked position form an opening together and lock the shaft of the seed holder by surrounding it in the plane of the lock ring.

BRIEF DESCRIPTION OF THE DRAWING

FIG. 1a is a cut away schematic perspective showing the pull shaft prior to pulling a crystal;

FIG. 1b is a perspective subsequent to pulling;

FIGS. 5 to 9 show various phases of the uncoupling process;

DETAILED DESCRIPTION OF THE PREFERRED EMBODIMENT

Figure 1C:
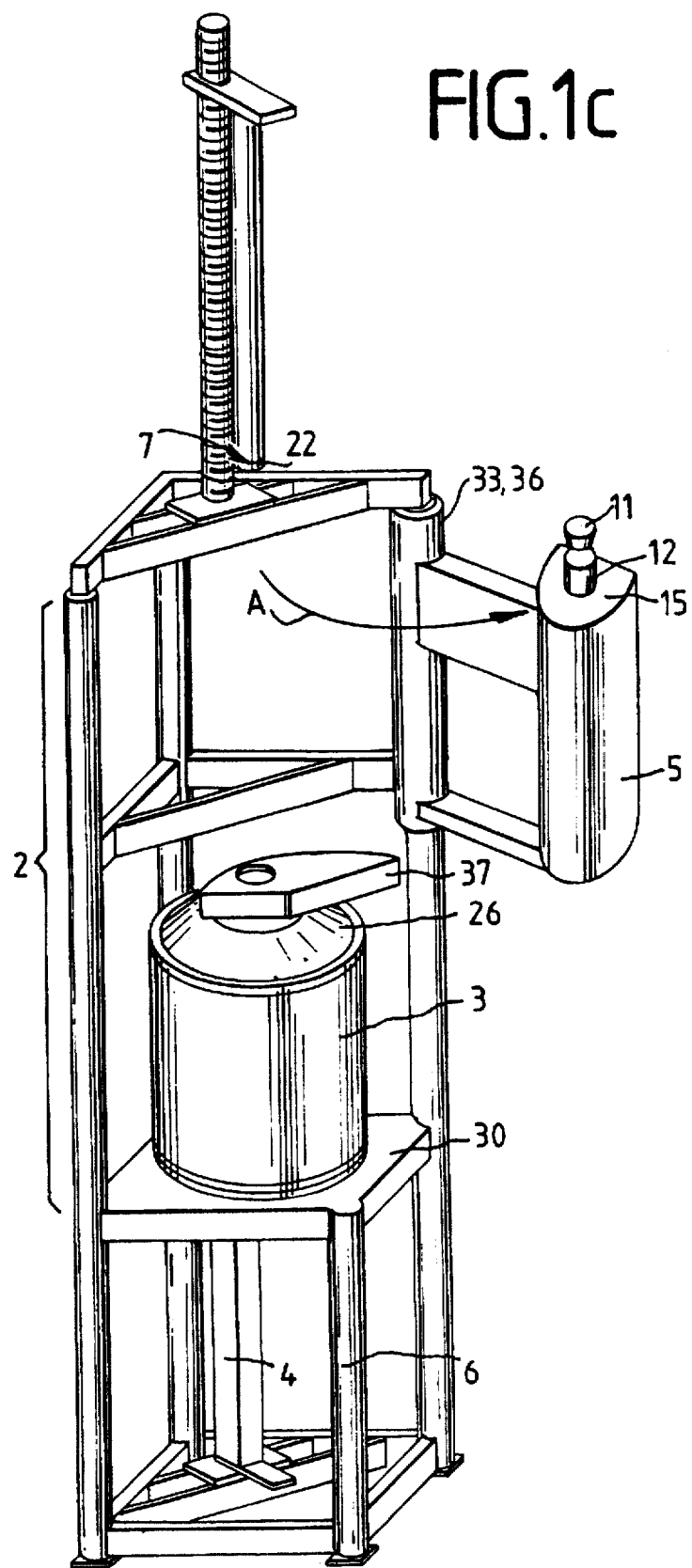
FIG. 1c is a perspective showing the airlock containing the pulled crystal swiveled outward from the apparatus.

As FIG. 1a shows, the pulling apparatus consists of a four-legged base frame 6 surmounted by a three-legged upper frame 2, the vacuum chamber 3 with the crucible and heater inside resting on the base frame 6, the crucible holding shaft 4 extending into the vacuum chamber from below. The pulling shaft 22 extends downward through chamber cover 15 into the airlock chamber 5 and is driven upward by the drive spindle 27 to the position of FIG. 1b. The swinging arm 28 for the airlock chamber 5 is mounted to the upper frame 2 by bearings 33, 36. When pulling is completed, the airlock chamber 5 containing the pulled crystal can be swiveled outward from the lock 37 to the position of FIG. 1c.

Figure 2:
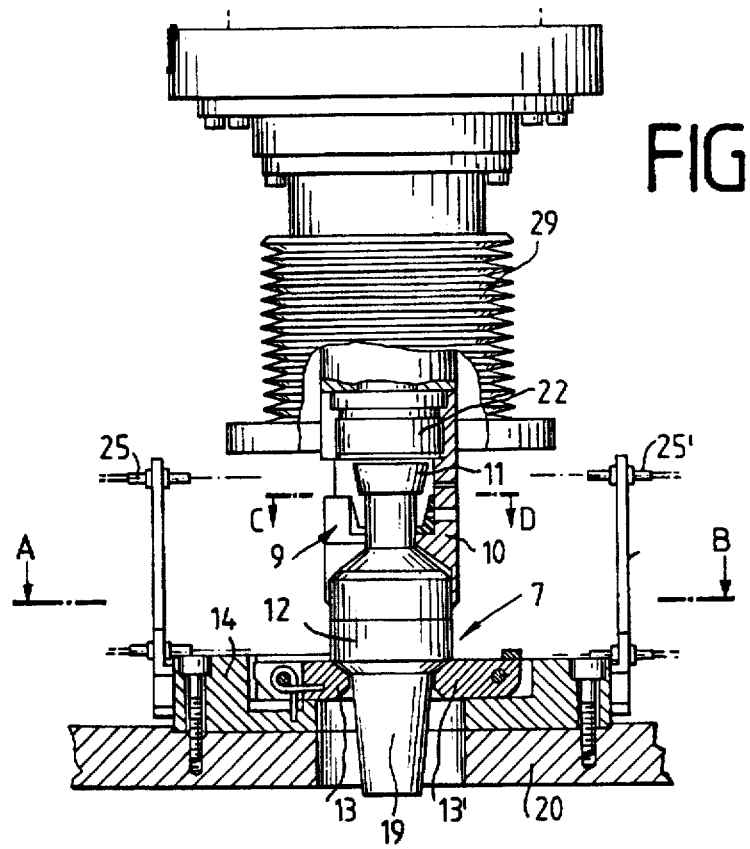
FIG. 2 is a partially sectioned side view.
Figure 3:
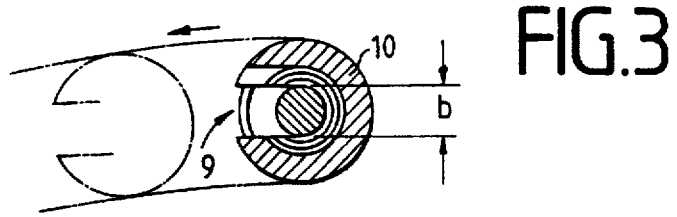
FIG. 3 is a section view of the coupling ring taken along line CD of FIG. 2.
Figure 4:
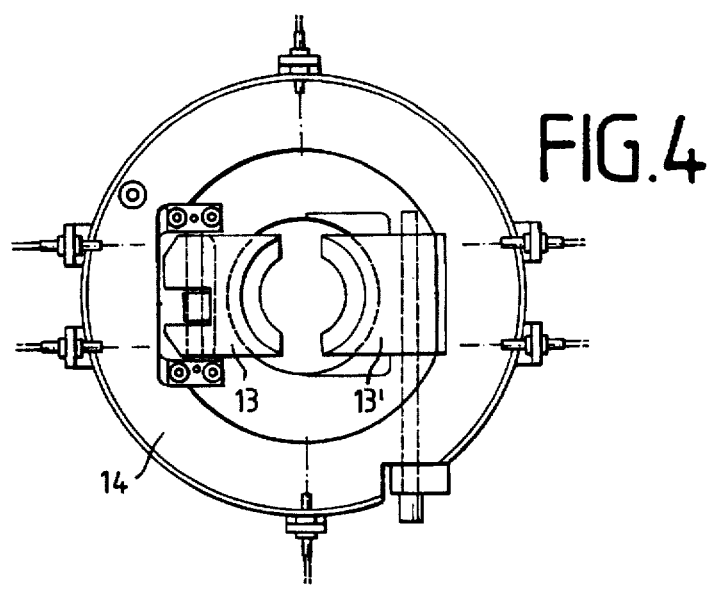
FIG. 4 is a plan view of the uncoupling device taken along line AB.

Referring to FIG. 2, the bottom end of the pulling shaft 22 is affixed to uncoupling device 7, which includes the coupling ring 10 which has a slot 9 whose width b is slightly larger than the diameter of the neck portion 18 of the crystal holder 12, but smaller than the diameter of the mushroom-shaped head portion 11.

After the pulling process is completed, the crystal 8 is in the airlock 5 where it hangs from the seed crystal holder 12. After this pulling process the pulling shaft 22 is rotated to the position shown in FIG. 1c and FIG. 5 and stops at a specific angle determined by the initiator and the photodetectors 25, 25'. Then the apparatus and the airlock are flooded and the bellows 29 is raised by pneumatic cylinders from the airlock chamber. By spring force and gravity, the two airlock gates swing to the horizontal position (locked position) as shown in FIG. 6.

By raising the airlock chamber 5 and top cover 15 which hold air-locking ring 14, the seed holder 12 with the appended crystal 8 settles down on the gates 13 and 13' (FIG. 9). Here a collar 30 above the tapered shaft 19 (FIG. 2) rests against the gates to form a seal. By continued raising of the airlock by the amount D, the seed holder 12 separates from the pulling shaft 22, while the mushroom-shaped head 11 (FIGS. 2 and 6) lifts away and comes free of the coupling ring 10.

Figure 10:
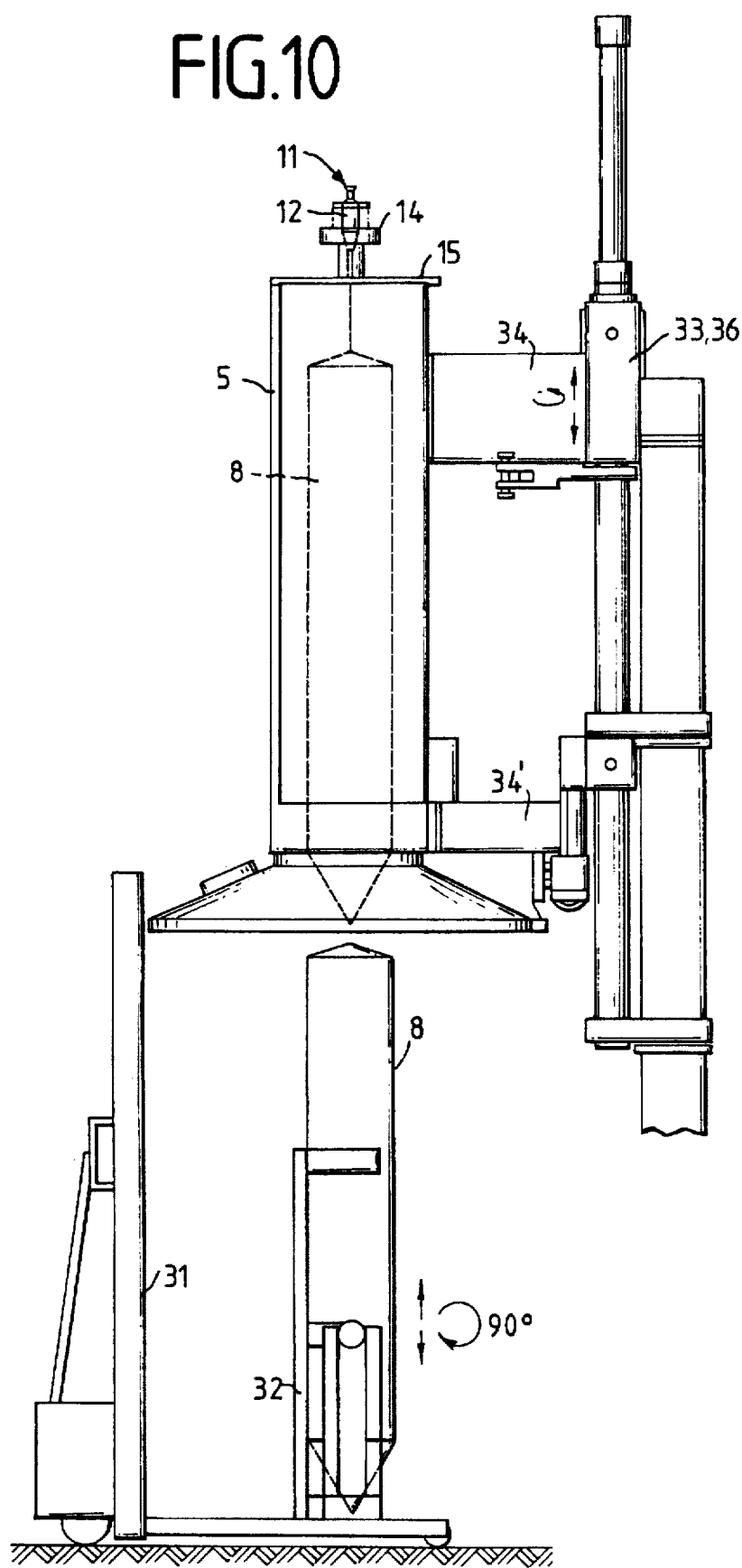
FIG. 10 is a side view showing the car for carrying the crystals away, as well as the parts of the airlock chamber swung away from the pulling apparatus.

Then the airlock chamber 5 with crystal 8 and the seed holder 12 hanging from the arm 34, 34' is pivoted hydraulically or electrically by an angle of about 90° about the shaft 33 to the position represented in FIG. 7 and FIG. 10.

To obtain sufficient free space between crystal 8 and the base 20, the entire airlock chamber 5 is again raised by about 30 mm, as shown in FIG. 8.

Then a wheeled car 31 is moved under the airlock 5 and a basket 32 is raised up until the crystal 8 rests on it and the airlock is lowered with respect to the crystal by about 300 mm (dimension E). Then the lock chamber 5 is opened, the seed crystal is severed, and the car 32 with the crystal 8 is lowered and rolled away.

After the airlock chamber 5 has been raised and lowered, it is swung back and the apparatus is ready to restart.

In the case of very long crystals 8, a catch pin is positioned on the hydraulic lift and thus the pulling pot and vacuum chamber 3 with the airlock is joined tightly to the vacuum chamber 3. As the airlock 5 is raised and turned, the pulling pot 3 follows it.

In order to clean the pulling pot 3, the pulling pot is set down after turning on a cam, and the airlock is raised and swung in again. Then the pulling pot can be turned and cleaned. Restoration of the apparatus is performed in reverse order.

It is still possible to remove a crystal through the opened door even in the assembled state of the apparatus.

We claim:

1. An apparatus for pulling a monocrystal from a melt, said apparatus comprising
    a frame,
    a vacuum chamber supported on said frame, said vacuum chamber containing a crucible and a heating element for heating the crucible,
    a puller located above said vacuum chamber for pulling a crystal upward from a melt in said crucible,
    an airlock chamber which can be swung laterally with respect to said frame, said airlock chamber having a pulling position located between said vacuum chamber and said puller so that said puller can pull said crystal into said airlock chamber, said airlock chamber having a top cover,
    an airlock ring held by said cover,
    a pair of airlock gates journaled to horizontal axes on said airlock ring for pivoting movement from a closed position to an open position, said gates in said closed position to an open position, said gates in said closed position defining an opening therebetween,
    a crystal holder which is detachably carried by said puller, said crystal holder comprising a shaft which is sealably received in said opening when said airlock gates are closed.

2. An apparatus as in claim 1 further comprising a coupling ring carried by said puller, said coupling ring having a longitudinal slot, said crystal holder further comprising a neck having a head thereabove, said neck being received in said longitudinal slot when said airlock chamber is in a pulling position.

3. An apparatus as in claim 1 wherein said airlock gates are substantially horizontal in said closed position, said crystal holder having a collar above said shaft to hold said gates closed by gravity when said shaft is received in said opening.

4. An apparatus as in claim 3 wherein said gates are spring loaded upward toward said open position.

5. An apparatus as in claim 2 further comprising
    an electric motor for raising and lowering said pull shaft,
    a flap valve for closing said airlock chamber,
    photodetection means fixed with respect to said airlock ring for determining the position of the crystal holder relative to the coupling ring, and
    circuit means responsive to signals generated by said photodetection means for turning off said electric motor when said slot is on line with said flap valve.

6. A method for pulling monocrystals out of a melt situated in a crucible under vacuum or under shielding gas at a reduced pressure,
    wherein the crucible is disposed in a vacuum chamber (3) mounted on a basic frame (6), and
    wherein a puller (22) supported on an upper frame (2) held by the basic frame (6) is provided above the melt, by which the crystal (8) can be pulled upward from the melt surface into an airlock chamber (5),
    and also an uncoupling device (7) is provided between the crystal (8) and the puller and permits the separation of the crystal (8) from the puller (22), characterized in that, after the pulling process is completed, the airlock chamber (5), held by a swivel arm (34, 34') on the upper frame (2), is not in a first step raised up, the crystal (8) being held in fixed location by the pull shaft (22), while locking means (13, 13') held on the airlock chamber (5) move beneath the crystal holder (12) on which the crystal (8) hangs and fix the latter in its position with respect to the airlock chamber, in a second step the airlock chamber (5) together with the crystal (8) is raised so that the projecting part of the head (11) of the crystal holder (12) comes free from the coupling ring (10) and thus from the pull shaft (22), in a third step the crystal (8) together with the airlock chamber hanging from the swivel arm (28) is turned in a horizontal movement into the unloading position, and in a fourth step the crystal (8) or the basket of a lift truck (310 is raised so that the crystal holder (12) comes loose from the locking means and can be separated from the crystal.

* * * * *